United States Patent
Iijima

(10) Patent No.: US 9,786,467 B2
(45) Date of Patent: Oct. 10, 2017

(54) PHASE PLATE, METHOD OF FABRICATING SAME, AND ELECTRON MICROSCOPE

(71) Applicant: JEOL Ltd., Tokyo (JP)

(72) Inventor: Hirofumi Iijima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/067,394

(22) Filed: Mar. 11, 2016

(65) Prior Publication Data

US 2016/0276125 A1 Sep. 22, 2016

(30) Foreign Application Priority Data

Mar. 12, 2015 (JP) .................................. 2015-49439

(51) Int. Cl.
| | |
|---|---|
| H01J 37/04 | (2006.01) |
| H01J 37/147 | (2006.01) |
| H01J 37/26 | (2006.01) |
| H01J 37/02 | (2006.01) |

(52) U.S. Cl.
CPC ............ *H01J 37/147* (2013.01); *H01J 37/04* (2013.01); *H01J 37/26* (2013.01); *H01J 37/026* (2013.01); *H01J 2237/2614* (2013.01); *H01J 2237/2802* (2013.01)

(58) Field of Classification Search
CPC .......... H01J 37/147; H01J 37/26; H01J 37/04; H01J 37/026; H01J 2237/2802; H01J 2237/2614
See application file for complete search history.

(56) References Cited

U.S. PATENT DOCUMENTS

| | | | | |
|---|---|---|---|---|
| 7,851,757 B2* | 12/2010 | Nagayama | ............... | H01J 37/26 250/306 |
| 8,487,268 B2* | 7/2013 | Gerthsen | ................. | H01J 37/12 250/309 |
| 2008/0202918 A1* | 8/2008 | Nagayama | ............... | H01J 37/26 204/192.11 |
| 2008/0296509 A1* | 12/2008 | Schroder | ................. | H01J 37/26 250/398 |
| 2011/0174971 A1* | 7/2011 | Malac | ..................... | H01J 37/04 250/307 |
| 2014/0183358 A1* | 7/2014 | Iijima | ..................... | H01J 37/04 250/311 |

FOREIGN PATENT DOCUMENTS

JP 2006162805 A 6/2006

\* cited by examiner

*Primary Examiner* — Brooke Purinton
(74) *Attorney, Agent, or Firm* — The Webb Law Firm

(57) ABSTRACT

A phase plate capable of suppressing electrification and a method of fabricating the plate are provided. The phase plate is for use in an electron microscope and includes a phase control layer provided with a through-hole and at least one conductive layer covering and closing off the through-hole. The conductive layer is formed on at least one of a first surface and a second surface of the phase control layer, the second surface being on the opposite side of the first surface. The phase control layer produces a given phase difference between electron waves transmitted through the phase control layer and electron waves transmitted through the through-hole.

9 Claims, 11 Drawing Sheets

Phase Plate, Method of Fabricating Same, and Electron Microscope

CROSS-REFERENCE TO RELATED APPLICATION

This application claims priority to Japanese Patent Application No. 2015-49439 filed Mar. 12, 2015, the disclosure of which is hereby incorporated in its entirety by reference.

BACKGROUND OF THE INVENTION

1. Field of the Invention

The present invention relates to a phase plate and also to a method of fabricating it. Further, the invention relates to an electron microscope.

2. Description of the Related Art

A sample to be examined by a transmission electron microscope (TEM) or scanning transmission electron microscope (STEM) equipped with a phase plate is called a weak phase object which, when an electron beam hits it, produces only phase variations without varying the intensity of the electron beam transmitted through the sample. In particular, examples of such a sample include light element samples such as undyed biological samples (samples embedded in resin and samples embedded in ice) and macromolecules which produce only low contrast when observed in absorption contrast or in scattering contrast.

Phase plates are employed in phase contrast transmission electron microscopes and phase contrast scanning transmission electron microscopes. Each phase plate has a thin film that is centrally provided with a quite small through-hole (e.g., having a diameter on the order of 1 micrometer). In a phase contrast transmission electron microscope, some of electron waves transmitted through a sample are varied in phase by placing a phase plate in the back focal plane of an objective lens. As a result, phase contrast can be obtained. On the other hand, in a phase contrast scanning transmission electron microscope, a phase plate is placed in the front focal plane of an objective lens. Phase contrast can be detected by irradiating a sample with electron waves of different phases.

Such a phase plate installed in a transmission electron microscope or a scanning transmission electron microscope presents the problem that degradation occurs due to electrification. For example, in patent document 1, there is disclosed a phase plate structure for preventing lens effects due to electrification because it is considered difficult to prevent electrification of the phase plate.

CITATION LIST

Patent Documents

Patent document 1: JP-A-2006-162805

FIG. 25 is a schematic cross-sectional view of one conventional phase plate, 1A. As shown in FIG. 25, the phase plate 1A is composed of a thin film 4A having a quite small hole 2A and a support grid 6A providing support of the thin film 4A. Ideally, the size of the hole 2A is infinitesimal. In actuality, however, the diameter is approximately 1 micrometer because of limited machining accuracy with which the hole is formed and difficulty with which the position of the hole 2A is adjusted through visual inspection. The thickness of the phase plate 1A is so adjusted that the phase of electron waves transmitted through the thin film 4A is delayed by an odd multiple of $\pi/2$.

As described previously, a thin-film phase plate deteriorates quickly due to electrification and thus presents the problem that the life is short. If an electron beam hits the phase plate, secondary electrons are emitted from the surface of the phase plate and positive holes are left. Therefore, the region of the phase plate irradiated with the electron beam is charged positively. If the amount of charge on the surface of the phase plate increases due to electrification, electrons undergo phase modulating action of electric charges as well as the action of the phase plate. This makes it impossible to obtain correct phase contrast. If electrification of the phase plate due to electron beam irradiation can be prevented, deterioration of the phase plate is suppressed. Consequently, the life of the phase plate will be improved.

SUMMARY OF THE INVENTION

In view of the foregoing problem the present invention has been made. One object associated with some aspects of the present invention is to provide a phase plate capable of suppressing electrification. Another object is to provide a method of fabricating this phase plate. A further object associated with some aspects of the invention is to provide an electron microscope including this phase plate.

(1) A phase plate associated with the present invention is adapted for use in an electron microscope and comprises: a phase control layer provided with a through-hole and having a first surface and a second surface on the opposite side of the first surface; and at least one electrically conductive layer formed on at least one of the first and second surfaces of the phase control layer and covering and closing off the through-hole. The phase control layer produces a given phase difference between electron waves transmitted through the phase control layer and electron waves transmitted through the through-hole.

In this phase plate, the conductive layer covers and closes off the through-hole formed in the phase control layer and, therefore, electric charges on the edges of the phase control layer (fringes of the through-hole) at which electric charges tend to collect can be dissipated away. Consequently, electrification of the phase plate can be more suppressed, for example, as compared with the case where the through-hole formed in the phase control layer is not closed off. This in turn can reduce deterioration due to electrification of the phase plate. Hence, the life of the phase plate can be prolonged.

(2) In one feature of this phase plate, the at least one electrically conductive layer may be two which are formed on the first and second surfaces, respectively.

In this phase plate, electric charges on the edges of the phase control layer (i.e., the fringes of the through-hole) can be more effectively dissipated away. In consequence, electrification of the phase plate can be more suppressed.

(3) In another feature of the phase plate set forth in (1) above, the electrically conductive layer may have a constant thickness.

(4) A phase plate associated with the present invention is adapted for use in an electron microscope and comprises a phase control layer having a bottomed recessed portion. The phase control layer has a first portion overlapping the recessed portion as viewed within a plane and a second portion surrounding the recessed portion as viewed within a plane. The second portion is thicker than the first portion. The phase control layer produces a given phase difference between electron waves transmitted through the first portion and electron waves transmitted through the second portion.

In this phase plate, the phase control layer has the recessed portion and so electric charges on the edges of the phase control layer can be dissipated away more effectively, for example, as compared with the case where the phase control layer is provided with a through-hole. Therefore, electrification of the phase plate can be suppressed and thus deterioration of the phase plate due to electrification can be reduced. As a result, the life of the phase plate can be prolonged.

(5) A method associated with the present invention to fabricate a phase plate for use in an electron microscope comprises the steps of: forming an electrically conductive layer on a substrate; forming a phase control layer on the conductive layer, the phase control layer being provided with a through-hole; and etching the substrate from its surface on the opposite side of a surface of the substrate on which the conductive layer has been formed to form an opening that exposes the conductive layer. The phase control layer produces a given phase difference between electron waves transmitted through the phase control layer and electron waves transmitted through the through-hole.

In this method of fabricating a phase plate, the phase plate can be fabricated with simple process steps.

(6) In one feature of this fabrication method, the step of forming the phase control layer may include the steps of: forming the phase control layer on the conductive layer; and patterning the phase control layer by photolithography and etching to form the through-hole.

In this method of fabricating a phase plate, the through-hole is formed by patterning the phase control layer by photolithography and etching. Therefore, the phase plate can be fabricated with simpler steps, for example, as compared with the case where the through-hole is formed in the phase control layer using a focused ion beam (FIB) system. Furthermore, phase plates can be mass-produced economically.

(7) In one feature of this method of fabricating a phase plate, during the step of forming the phase control layer, the phase control layer provided with the through-hole may be formed by a lift-off technique.

In this method of fabricating a phase plate, the phase control layer provided with the through-hole is formed by a lift-off technique and so the phase plate can be fabricated with simpler processing steps, for example, as compared with the case where the through-hole is formed in the phase control layer using a focused ion beam system or other equipment. In addition, phase plates can be mass-produced at low cost.

(8) Another method associated with the present invention is adapted to fabricate a phase plate for use in an electron microscope. This method comprises the steps of: forming a phase control layer on a substrate; forming a bottomed recessed portion in the phase control layer to form a first portion and a second portion thicker than the first portion in the phase control layer, the first portion overlapping the recessed portion as viewed within a plane, the second portion surrounding the recessed portion as viewed within a plane; and etching the substrate from its surface on the opposite side of a surface of the substrate on which the phase control layer has been formed to form an opening that exposes the phase control layer. The phase control layer produces a given phase difference between electron waves transmitted through the first portion and electron waves transmitted through the second portion.

With this method of fabricating a phase plate, the phase plate can be fabricated with simple process steps.

(9) In one feature of this fabrication method, the substrate may be a silicon substrate.

In this method of fabricating a phase plate, the phase plate can be fabricated with simple processing steps using semiconductor manufacturing technology.

(10) In another feature of this fabrication method, during the step of forming the phase control layer, the phase control layer may be formed by vacuum evaporation, sputtering, ion plating, or CVD.

In this method of fabricating a phase plate, the phase plate can be fabricated with simple processing steps. Furthermore, phase plates can be mass-produced economically.

(11) An electron microscope associated with the present invention includes a phase plate associated with the present invention.

Since this electron microscope includes the phase plate associated with the invention, good phase contrast images less affected by the effects of electrification of the phase plate can be obtained.

DETAILED DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

1. First Embodiment

1.1. Phase Plate

Figure 1:
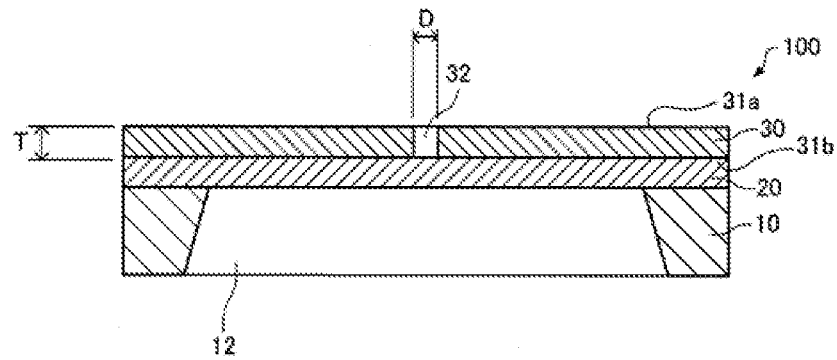
FIG. 1 is a schematic cross-sectional view of a phase plate associated with a first embodiment of the present invention.

A phase plate associated with a first embodiment of the present invention is first described by referring to FIG. 1, which schematically shows the phase plate, 100, associated with the first embodiment.

The phase plate 100 is for use in an electron microscope such as a transmission electron microscope or a scanning transmission electron microscope. As shown in FIG. 1, the phase plate 100 includes a support body 10, an electrically conductive layer 20, and a phase control layer 30.

The support body 10 supports the conductive layer 20 and the phase control layer 30. The support body 10 is provided with an opening 12. The opening 12 extends through the support body 10 and exposes the lower surface of the conductive layer 20. The top of the opening 12 is covered by the conductive layer 20. The opening 12 is rectangular in planar form. For example, the rectangle measures 100 µm or more by 500 µm or less. No restrictions are placed on its shape and size. The support body 10 is made, for example, of silicon, in which case the phase plate 100 can be easily fabricated using semiconductor fabrication technology. No restriction is placed on the material of the support body 10. The material can be glass, ceramic, metal, semiconductor, synthetic resin, or the like. The planar shape of the support body 10 may be a circle, a polygon, or the like. The thickness of the support body 10 is between 100 µm and 300 µm, inclusive, for example.

The conductive layer 20 is supported by the support body 10 and formed on the upper surface of the support body 10 and also on the opening 12. The conductive layer 20 is formed underside a second surface (lower surface) 31b of the phase control layer 30. The conductive layer 20 covers and closes off a through-hole 32 formed in the phase control layer 30. Also, the conductive layer 20 closes off the opening of the through-hole 32 on the second surface (31b) side of the phase control layer 30. The thickness of the conductive layer 20 is constant. No restriction is placed on the thickness of the conductive layer 20 and approximately between 10 nm and 50 nm, inclusive, for example.

The electrically conductive layer has electrical conductivity. Preferably, the conductive layer 20 has high electrical conductivity and is amorphous. For example, the conductive layer 20 is a layer of amorphous carbon. The conductive layer 20 may also be a layer of a metal such as Ti, IGZO, Au—Si, Pd—Si, $Cu_{40}Zr_{60}$, $Fe_{20}B_{20}$, $Co_{90}Zr_{10}$, and $Ni_{78}Si_{10}B_{12}$. Where the conductive layer 20 is made of a metal layer, it is desired to use a layer of Ti because it exhibits good electrical conductivity and is formed amorphously.

The phase control layer 30 is formed on the conductive layer 20 and provided with the through-hole 32. The through-hole 32 extends fully between a first surface (upper surface) 31a of the phase control layer 30 and the second surface 31b on the opposite side of the first surface 31a. The through-hole 32 has a diameter D of between 1 µm and 3 µm, inclusive, for example. The planar shape of the through-hole 32 is a circle, for example. No restriction is imposed on the planar shape of the through-hole 32. It may be a polygon or ellipse.

The phase control layer 30 produces a given phase difference between electrons transmitted through the phase control layer 30 and electrons transmitted through the through-hole 32. The phase control layer 30 can determine the degree to which the phase of electron waves passing through the phase control layer 30 is varied depending on the thickness of the control layer 30, i.e., the distance between the first surface 31a and the second surface 31b.

The phase control layer 30 can shift or delay the phase of scattering waves passed through the phase control layer 30 with respect to the phase of electron waves passed through the through-hole 32 by an odd multiple of $\pi/2$. The thickness T of the phase control layer 30 is so set as to vary or delay the phase of electron waves by an odd multiple of $\pi/2$. The thickness T of the phase control layer 30 is between 30 nm and 100 nm, inclusive, for example.

Preferably, the phase control layer 30 has high electrical conductivity and is amorphous. For example, an amorphous carbon layer or a layer of any one of various metals exemplified as the conductive layer 20 can be used as the phase control layer 30. The material of the phase control layer 30 may be different from, or the same as, that of the conductive layer 20.

Figure 2:
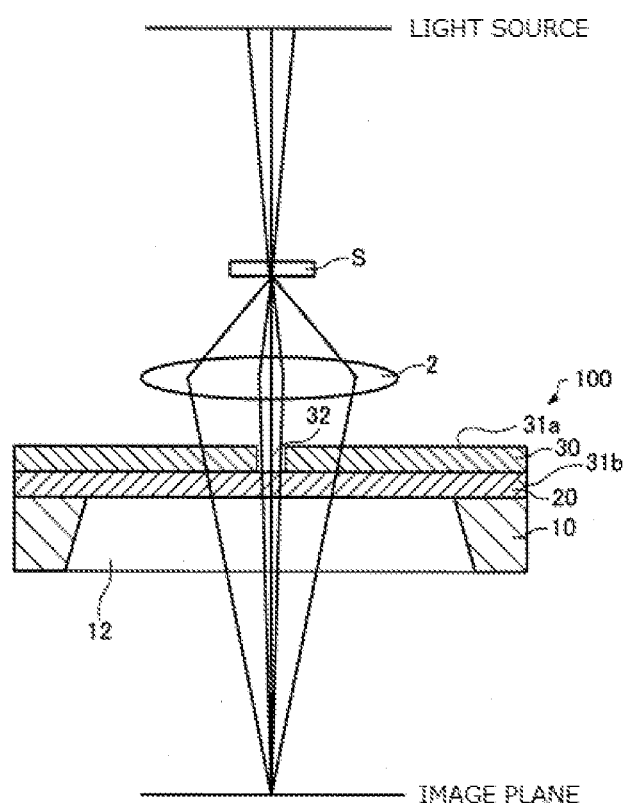
FIG. 2 is an electron-optical ray diagram, partly in cross section, illustrating the operation of the phase plate of FIG. 1 in a transmission electron microscope.

The operation of the phase plate associated with the first embodiment is next described. First, an example in which the phase plate 100 is installed in a transmission electron microscope (TEM) is presented. FIG. 2 illustrates the operation of the phase plate 100 in a transmission electron microscope (phase contrast transmission electron microscope) equipped with the phase plate 100.

In the phase contrast transmission electron microscope, the phase plate 100 (especially, the phase control layer 30) is placed in the back focal plane of an objective lens 2. Electron waves (direct waves) transmitted through a sample S after being emitted from a light source and hitting the sample S pass through the through-hole 32 and the conductive layer 20 and reach an image plane. Electron waves diffracted by the sample S pass through the phase control layer 30 and the conductive layer 20 and reach the image plane. The direct waves and the diffracted waves interfere with each other at the image plane. At this time, the direct waves pass through the through-hole 32, while the diffracted waves pass through the phase control layer 30. Therefore, the diffracted waves deviate in phase from the direct waves by an amount corresponding to the thickness of the phase control layer 30. Consequently, a phase contrast occurs at the image plane. The conductive layer 20 produces no relative phase deviation because both the direct waves and the diffracted waves pass through the conductive layer 20. For this reason, no restriction is imposed on the thickness of the conductive layer 20.

Figure 3:
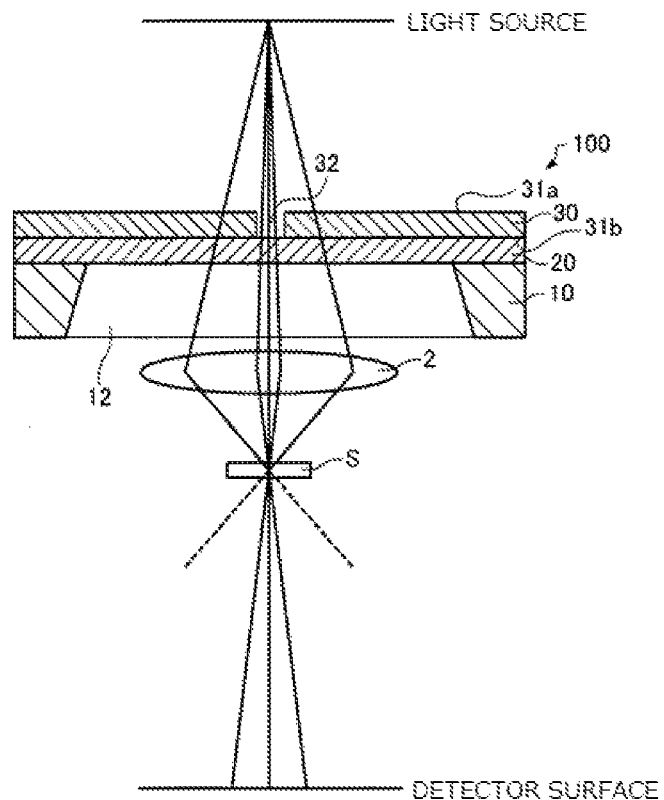
FIG. 3 is an electron-optical ray diagram, partly in cross section, illustrating the operation of the phase plate of FIG. 1 in a scanning transmission electron microscope.

An example in which the phase plate 100 is installed in a scanning transmission electron microscope (STEM) is next presented. FIG. 3 illustrates the operation of the phase plate 100 in the scanning transmission electron microscope (phase contrast scanning transmission electron microscope) equipped with the phase plate 100.

In the scanning transmission electron microscope, the phase plate 100 (especially, the phase control layer 30) is placed at the front focal plane of the objective lens 2. Electron waves transmitted through the through-hole 32 and conductive layer 20 and electron waves transmitted through the phase control layer 30 and conductive layer 20 are focused onto the sample S. The focused electrons (direct waves) transmitted through the sample S and the focused electrons diffracted by the sample S reach the detector surface. At this time, the direct waves transmitted through the through-hole 32 and the diffracted waves transmitted through the phase control layer 30 interfere with each other on the detector surface. Because a relative phase difference is given between the direct waves and the diffracted waves, a phase contrast occurs on the detector surface.

The phase plate 100 has the following features. The phase plate 100 is configured including the phase control layer 30 provided with the through-hole 32 and the conductive layer 20 which is formed on the second surface 31b of the phase control layer 30 and closes off the through-hole 32. The edges of the phase control layer, i.e., the fringes of the through-hole, are locations where electric charges tend to collect or become concentrated when the phase plate is irradiated with an electron beam. In the phase plate 100, electric charges at the edges of the phase control layer 30 (i.e., the fringe of the through-hole 32) can be dissipated away because the conductive layer 20 covers and closes off the through-hole 32. Consequently, electrification of the phase plate can be more suppressed, for example, as compared with the case where the through-hole formed in the phase control layer is not closed off. This can reduce deterioration due to electrification of the phase plate and thus the life of the phase plate can be prolonged.

Furthermore, in the phase plate 100, the phase control layer 30 and the conductive layer 20 are stacked. Therefore, the electrical conductivity of the phase plate can be improved, for example, as compared with the case where the phase plate is made of a single layer. As a result, deterioration of the phase plate due to electrification can be reduced. In consequence, the life of the phase plate can be prolonged.

Additionally, in the phase plate 100, the thickness of the conductive layer 20 is constant. As described previously, the conductive layer 20 varies the phase of all the electron waves. In this way, the conductive layer 20 does not need to have a function of selectively varying phases of certain electron waves. Consequently, in the phase plate 100, the thickness and material of the conductive layer 20 can be selected at will. Also, it is easy to fabricate the phase plate.

1.2. Method of Fabricating Phase Plate

Figure 4:
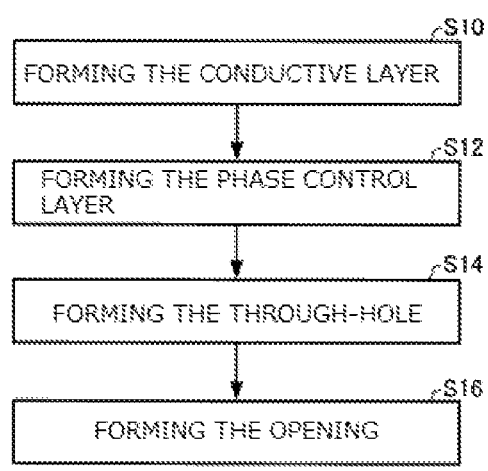
FIG. 4 is a flowchart illustrating one example of the method of fabricating the phase plate of FIG. 1 associated with the first embodiment.

A method of fabricating the phase plate associated with the first embodiment is next described by referring to FIGS. 4-8. FIG. 4 is a flowchart illustrating one example of the method of fabricating the phase plate 100 associated with the first embodiment. FIGS. 5-8 are cross-sectional views schematically illustrating a process sequence of fabricating the phase plate 100 associated with the first embodiment.

Figure 5:
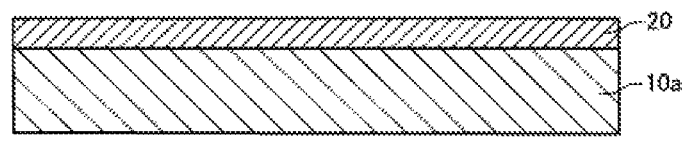
FIGS. 5-8 are cross-sectional views schematically illustrating a method of fabricating the phase plate of FIG. 1 associated with the first embodiment.

First, as shown in FIG. 5, the conductive layer 20 is formed on a substrate 10a (step S10). A semiconductor substrate such as a silicon substrate can be used as the substrate 10a. Various substrates such as ceramic substrate, glass substrate, sapphire substrate, synthetic resin substrate, etc. can be used as the substrate 10a. The conductive layer 20 is formed, for example, by vacuum evaporation, sputtering, ion plating, or CVD (chemical vapor deposition). The conductive layer 20 is formed over the whole upper surface of the substrate 10a.

Figure 6:
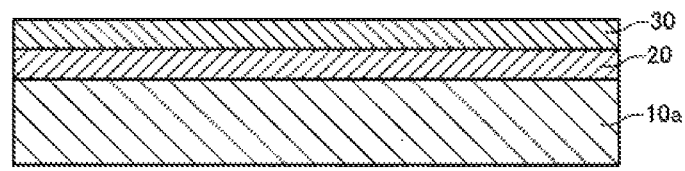

Then, as shown in FIG. 6, the phase control layer 30 is formed on the conductive layer 20 (step S12). The phase control layer 30 is formed, for example, by vacuum evaporation, sputtering, ion plating, or CVD. The phase control layer 30 is formed over the whole upper surface of the conductive layer 20.

Then, the through-hole 32 is formed in the phase control layer 30 (step S14). The through-hole 32 is formed by patterning the phase control layer 30 by photolithography and etching.

Figure 7:
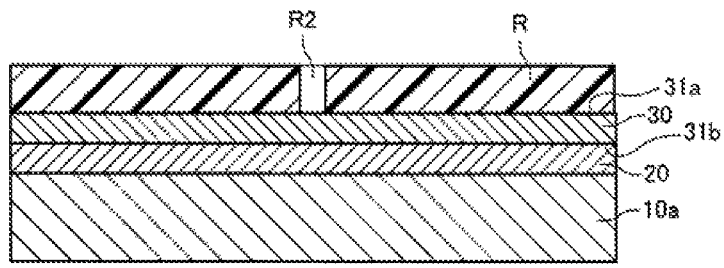
Figure 8:
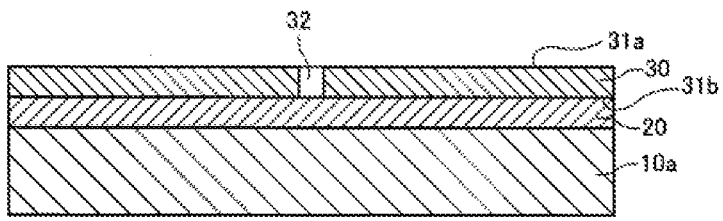

In particular, as shown in FIG. 7, a photoresist layer R is first formed on the phase control layer 30 using a spin coater or the like and then a shape conforming to the through-hole 32 is written in the photoresist layer R by laser light, an electron beam, or the like. The exposed photoresist R is developed to form a through-hole R2 in the photoresist layer R. Then, as shown in FIG. 8, the phase control layer 30 is etched and patterned using the photoresist layer R as a mask to form the through-hole 32 in the phase control layer 30. Where the conductive layer 20 and the phase control layer 30 are different in material, for example, the through-hole 32 may be formed by selectively etching the phase control layer 30 by making use of a difference in etch rate between the conductive layer 20 and the phase control layer 30. In this way, one side of the opening of the through-hole 32 formed in the phase control layer 30 is covered and closed off by the conductive layer 20. After forming the through-hole 32, the photoresist layer R is removed. Because of the process steps S12 and S14 described so far, the phase plate 30 provided with the through-hole 32 can be fabricated.

Then, as shown in FIG. 1, the substrate 10a is etched from its lower surface on the opposite side of the upper surface on which the conductive layer 20 has been formed, thus forming the opening 12 for exposing the conductive layer 20 (step S16). The opening 12 is formed, for example, by forming a mask layer (not shown) on the lower surface of the substrate 10a and etching the substrate 10a from its lower surface via the mask layer. The etching of the substrate 10a may be either wet etching or dry etching. After forming the opening 12, the mask layer is removed. Since the opening 12 is formed in the substrate 10a, the support body 10 is fabricated. Because of the processing steps described so far, the phase plate 100 can be manufactured.

The method associated with the present embodiment to fabricate the phase plate has the following features. This method comprises the steps of: forming the conductive layer 20 on the substrate 10a (step S10); forming the phase control layer 30 having the through-hole 32 on the conductive layer 20 (step S12); and forming the opening 12 for exposing the conductive layer 20 by etching the substrate 10a from its surface on the opposite side of the surface on which the conductive layer 20 has been formed (step S16). Therefore, as described previously, the phase plate can be fabricated using semiconductor fabrication techniques such as photolithography and etching. Consequently, the phase plate can be fabricated with simpler steps, for example, as compared with a method of fabricating a phase plate by depositing a thin film on a slide glass or a cleaved mica surface, peeling the thin film on water surface, transferring it onto a phase plate support member such as a molybdenum grid, and forming a through-hole in the thin film by a focused ion beam (FIB) system. Furthermore, in the method associated with the present embodiment to fabricate a phase plate, semiconductor fabrication techniques can be used and so phase plates can be mass-produced economically.

In the method associated with the present embodiment to fabricate a phase plate, the step (step S12) of forming the phase control layer 30 provided with the through-hole 32 includes the step of forming the phase control layer 30 on the conductive layer 20 and the step of patterning the phase control layer 30 by photolithography and etching to form the through-hole 32 in the phase control layer 30. As a consequence, the through-hole can be made in the phase control layer with simpler steps, for example, as compared with the case where the through-hole is formed in the phase control layer using a focused ion beam system. Furthermore, phase plates can be mass-produced at lower costs, for example, as compared with the case where the through-hole is formed in the phase control layer using a focused ion beam system.

In the method associated with the present embodiment to fabricate a phase plate, the substrate 10a is a silicon substrate. Therefore, the phase plate can be fabricated with simple process steps using semiconductor fabrication techniques.

In the fabrication method associated with the first embodiment for fabricating a phase plate, during the step of forming the phase control layer 30, this layer 30 is formed using vacuum evaporation, sputtering, ion plating, or CVD. Therefore, the phase plate can be fabricated with simple process steps. Furthermore, phase plates can be mass-produced economically.

1.3. Modification of Method of Fabricating Phase Plate

Figure 9:
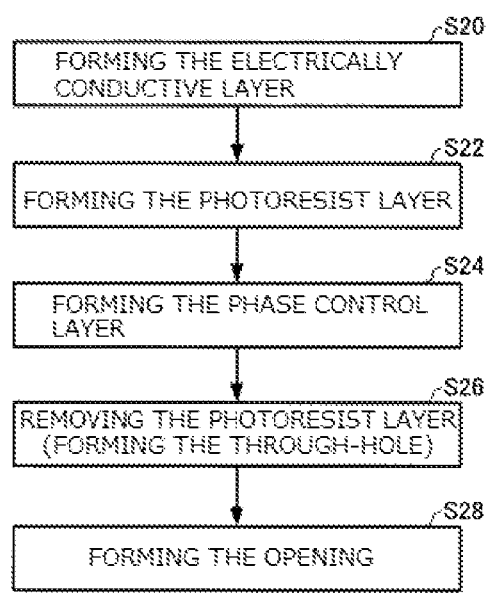
FIG. 9 is a flowchart illustrating a modification of the method illustrated in FIGS. 5-8.
Figure 10:
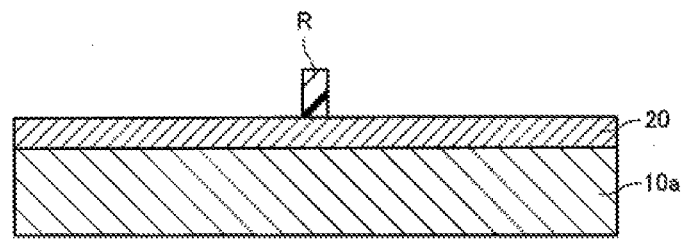
FIGS. 10-12 are cross-sectional views schematically illustrating the modification of the method of FIG. 9.
Figure 11:
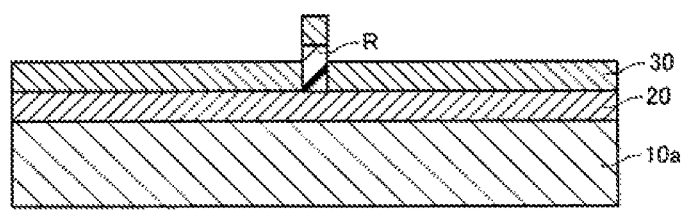
Figure 12:
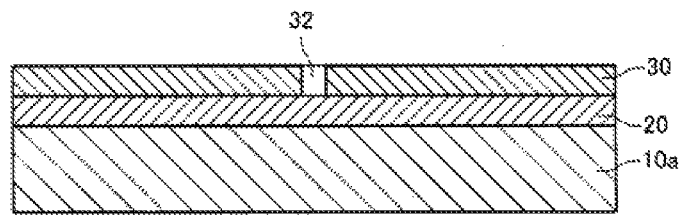

A modification of the method associated with the first embodiment to fabricate a phase plate is next described by referring to FIGS. 9-12. FIG. 9 is a flowchart illustrating the modification of the method associated with the first embodiment to fabricate the phase plate 100. FIGS. 10-12 are cross sections schematically illustrating process steps associated with the present modification to fabricate the phase plate 100.

In the above-described method of fabricating the phase plate 100 as illustrated in FIG. 4, after the phase control layer 30 is formed on the electrically conductive layer 20 (step S12), the phase control layer 30 is patterned by photolithography and etching to form the through-hole 32 in the phase control layer 30 (step S14).

On the other hand, in the present modification, the phase control layer 30 provided with the through-hole 32 is formed by a lift-off technique. First, the electrically conductive layer 20 is formed on the substrate 10a (step S20). This step is carried out in the same way as the step of forming the conductive layer 20 already described in connection with FIG. 4 (step S10) (see FIG. 5).

Then, the phase control layer 30 provided with the through-hole 32 is formed by a lift-off technique. In particular, a photoresist layer R is first formed on the conductive layer 20 as shown in FIG. 10 (step S22). The photoresist layer R is formed in that region of the conductive layer 20 which registers with the through-hole 32 as viewed within a plane when the through-hole 32 is formed. The photoresist layer R confirms with the shape of the through-hole 32, and is formed by photolithography. That is, the photoresist layer R is formed, for example, by forming the photoresist layer R on the conductive layer 20, then exposing the photoresist layer R, and developing the exposed photoresist layer R.

Then, as shown in FIG. 11, a phase control layer 30 is formed on the photoresist layer R and on the conductive layer 20 (step S24). The phase control layer 30 is formed, for example, by vacuum evaporation, sputtering, ion plating, or CVD.

Then, as shown in FIG. 12, the photoresist layer R is removed (step S26). Because of the process steps described so far, the phase control layer 30 having the through-hole 32 is formed.

Then, as shown in FIG. 1, the substrate 10a is etched from its lower surface to form an opening 12 for exposing the conductive layer 20 (step S28). This step is carried out in the same way as the step S16 for forming the opening 12 as already illustrated in FIG. 4. Because of the processing steps described so far, the phase plate 100 can be fabricated.

The present modification can yield advantageous effects similar to those produced by the above-described method associated with the first embodiment to fabricate the phase plate 100.

1.4. Modification of Phase Plate

Figure 13:
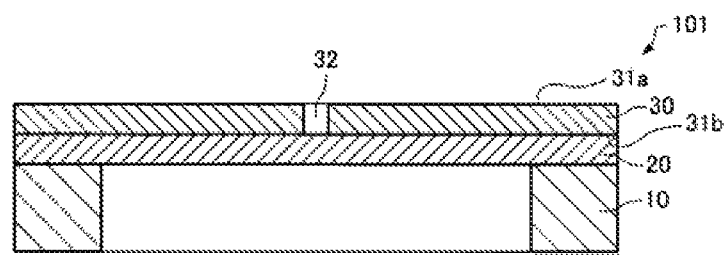
FIG. 13 is a schematic cross-sectional view of a phase plate associated with the modification of the first embodiment illustrated in FIGS. 9-12.

A modification of the phase plate associated with the first embodiment is next described by referring to FIG. 13, which is a cross-sectional view schematically showing the phase plate, 101, associated with the present modification. Those members of this phase plate 101 which are similar in function to their respective counterparts of the above-described phase plate 100 associated with the first embodiment are indicated by the same reference numerals as in the above-cited figures and a description thereof is omitted.

In the above-described phase plate 100, the support body 10 is a semiconductor substrate such as a silicon substrate in which the opening 12 has been etched.

On the other hand, in the phase plate 101, the support body 10 is a support grid. The support grid can be made of molybdenum, copper, gold, nickel, or other material. The phase plate 101 can yield advantageous effects similar to those produced by the above-described phase plate 100.

A method of fabricating the phase plate 101 is next described. Where the support grid is used as the support body 10, a thin film that will become the conductive film 20 is first deposited on a slide glass or cleaved mica surface. The thin film is peeled off at water surface and transferred onto the support grid. Then, a thin film that will become the phase control layer 30 is formed on a slide glass or cleaved mica surface. Subsequently, the through-hole is formed in the thin film using an FIB system. The thin film having the through-hole 32 is peeled off at water surface and transferred onto the conductive layer 20 that is supported on the support grid. In this way, the phase plate 101 can be fabricated.

2. Second Embodiment

2.1. Phase Plate

Figure 14:
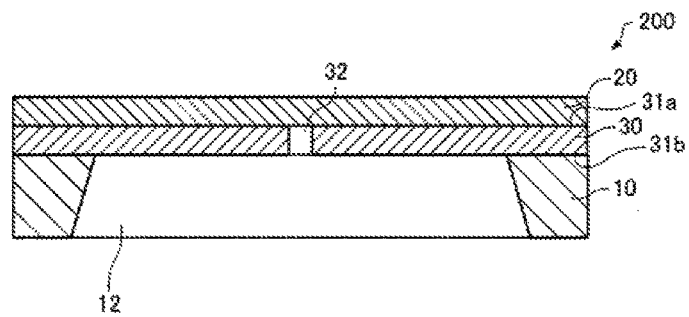
FIG. 14 is a schematic cross-sectional view of a phase plate associated with a second embodiment.

A phase plate associated with a second embodiment is next described by referring to FIG. 14, which is a cross-sectional view schematically showing the phase plate, 200, associated with the second embodiment. Those components of the phase plate 200 associated with the second embodiment which are similar in function with their respective counterparts of the above-described phase plate 100 associated with the first embodiment are indicated by the same reference numerals as in the above-cited figures and a description thereof is omitted.

In the above-described phase plate 100, the conductive layer 20 is formed underside the second surface 31b of the phase control layer 30 as shown in FIG. 1. In contrast, in the phase plate 200, the conductive layer 20 is formed on the first surface 31a of the phase control layer 30 as shown in FIG. 14.

The phase control layer 30 is formed on the upper surface of the support body 10 and also on the opening 12. The second surface 31b of the phase control layer 30 is exposed by the opening 12. The through-hole 32 is in communication with the opening 12 in the support body 10. The conductive layer 20 is formed on the phase control layer 30 and on the through-hole 32.

The operation of the phase plate 200 is next described. The phase plate 200 is similar in operation to the phase plate 100 except for the following respects. In the above-described phase plate 100, after passing through the phase control layer 30 or the through-hole 32, electron waves pass through the conductive layer 20. In the phase plate 200, after passing through the conductive layer 20, electron waves pass through the phase control layer 30 or the through-hole 32.

The phase plate 200 associated with the second embodiment can yield advantageous effects similar to those produced by the above-described phase plate 100 associated with the first embodiment.

2.2. Method of Fabricating Phase Plate

A method of fabricating the phase plate 200 associated with the second embodiment is next described. This method includes the steps of: forming the phase control layer 30 on a substrate; forming the electrically conductive layer 20 on the phase control layer 30; etching the substrate from its surface on the opposite side of a surface on which the phase control layer 30 has been formed to form the opening 12 for exposing the phase control layer 30; and forming the through-hole 32 in the phase control layer 30.

The step of forming the phase control layer 30 and the conductive layer 20 is carried out similarly to the steps S10 and S12 for forming the phase control layer 30 and the conductive layer 20 already described in connection with FIG. 4. Also, the step of forming the opening 12 is performed similarly to the step S16 of forming the opening 12 already described in connection with FIG. 4. In the step of forming the through-hole 32 in the phase control layer 30, the second surface 31b of the phase control layer 30 exposed by the opening 12 in the substrate, for example, is patterned by photolithography and etching, thus forming the through-hole 32. Alternatively, the through-hole 32 may be formed by a lift-off technique. Because of the process steps, the phase plate 200 can be fabricated.

The phase plate 200 can yield advantageous effects similar to those produced by the above-described method of fabricating the phase plate 100.

2.3. Modification of Phase Plate

Figure 15:
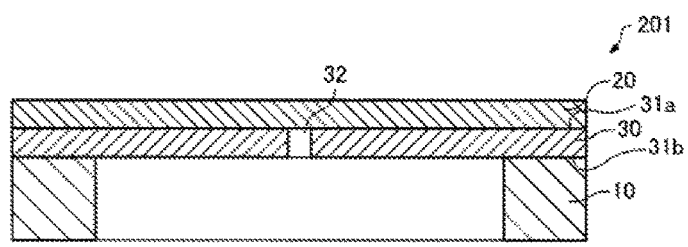
FIG. 15 is a schematic cross-sectional view of a phase plate associated with a modification of the second embodiment.

A modification of the phase plate associated with the second embodiment is next described by referring to FIG. 15, which is a cross-sectional view schematically showing the phase plate, 201, associated with this modification. Those members of the phase plate 201 associated with the present modification which are similar in function to their respective counterparts of the above-described phase plate 200 associated with the second embodiment are indicated by the same reference numerals as in the above-cited figures and a description thereof is omitted.

In the above-described phase plate 200, the support body 10 is a semiconductor substrate such as a silicon substrate in which the opening 12 has been etched.

In contrast, in the phase plate 201, the support body 10 is a support grid. The above examples of the phase plate 101, for example, can be used as the support grid. The phase plate 201 can yield advantageous effects similar to those produced by the above-described phase plate 200.

The method of fabricating the phase plate 201 is similar to the method of fabricating the phase plate 101 except that the conductive layer 20 is transferred after a thin film becoming the phase control layer 30 having the through-hole 32 is transferred. Therefore, a description of the method is omitted herein.

3. Third Embodiment

3.1. Phase Plate

Figure 16:
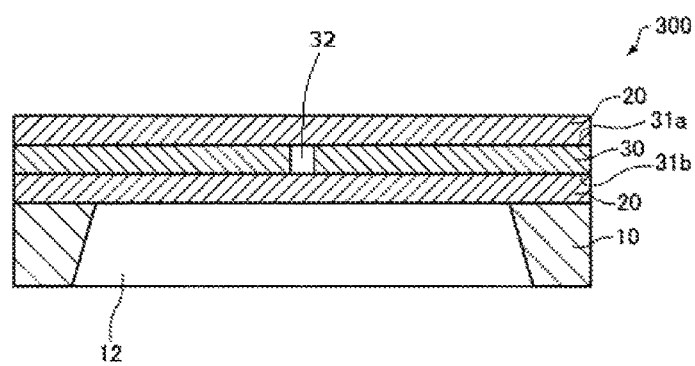
FIG. 16 is a schematic cross-sectional view of a phase plate associated with a third embodiment.

A phase plate associated with a third embodiment is next described by referring to FIG. 16, which is a cross-sectional view schematically showing the phase plate, 300, associated with the third embodiment. Those members of the phase plate 300 associated with the third embodiment which are similar in function to their respective counterparts of the above-described phase plate 100 associated with the first embodiment are indicated by the same reference numerals as in the above-cited figures and a description thereof is omitted.

In the above-described phase plate 100, as shown in FIG. 1, the conductive layer 20 is formed on the second surface 31b of the phase control layer 30.

In contrast, in the phase plate 300, as shown in FIG. 16, conductive layers 20 are formed on the first surface 31a and the second surface 31b, respectively, of the phase control layer 30.

In the phase plate 300, the phase control layer 30 and through-hole 32 are sandwiched between the conductive layers 20. Both the opening of the through-hole 32 on the side of the first surface 31a of the phase control layer 30 and the opening of the through-hole 32 on the side of the second surface 31b are covered and closed off by the conductive layers 20.

The operation of the phase plate 300 is next described. In a phase contrast transmission electron microscope, none of the conductive layer 20 formed on the first surface 31a of the phase control layer 30 of the phase plate 300 and the conductive layer 20 formed on the second surface 31b of the phase control layer 30 cause phase deviations in direct waves and diffracted waves. The sample principle applies to a phase contrast scanning transmission electron microscope. Therefore, the phase plate 300 is similar in operation to the above-described phase plate 100.

In the phase plate 300, the conductive layers 20 are formed on the first surface 31a and the second surface 31b, respectively, of the phase control layer 30. Therefore, electric charges on the edges of the phase control layer 30 (i.e., the fringes of the through-hole 32) can be better dissipated away, for example, as compared with the case where one conductive layer is formed on only one surface of the phase control layer. Consequently, electrification of the phase plate can be suppressed further. A support grid (not shown) may be used as the support body 10 in the phase plate 300.

3.2. Method of Fabricating Phase Plate

A method of fabricating the phase plate associated with the third embodiment is similar to the above-described method of fabricating the phase plate 100 as illustrated in FIG. 4 except that the conductive layers 20 are formed on the phase control layer 30 and on the through-hole 32 after the step S14 of forming the through-hole 32 in the phase control layer 30 and so a description of this method is omitted herein.

Where a support grid is used as the support body 10, this method is similar to the above-described method of fabricating the phase plate 101 except that the conductive layers 20 are transferred onto the phase control layer 30 after transferring the conductive layers 20 and the phase control layer 30 having the through-hole 32 onto the support grid.

4. Fourth Embodiment

4.1. Phase Plate

Figure 17:
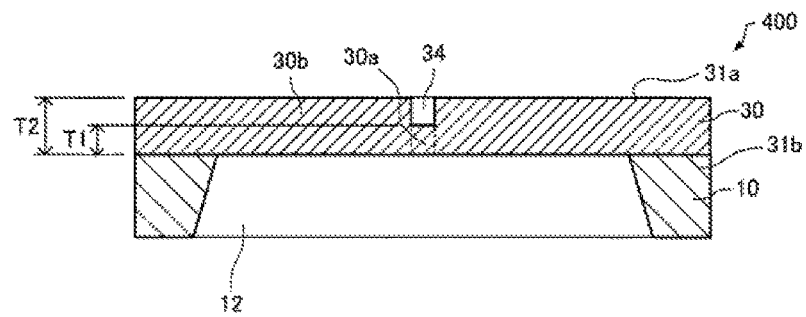
FIG. 17 is a schematic cross-sectional view of a phase plate associated with a fourth embodiment.

A phase plate associated with a fourth embodiment is next described by referring to FIG. 17, which is a schematic cross-sectional view of the phase plate, 400, associated with the fourth embodiment. Those members of the phase plate 400 associated with the fourth embodiment which are similar in function to their respective counterparts of the phase plate 100 associated with the first embodiment are indicated by the same reference numerals as in the above-cited figures and a description thereof is omitted.

In the above-described phase plate 100, the phase control layer 30 is provided with the through-hole 32 as shown in FIG. 1. In contrast, in the phase plate 400, the phase control layer 30 has a recessed portion 34 as shown in FIG. 17.

The phase control layer 30 is formed on the upper surface of the support body 10 and on the opening 12. The recessed portion 34 is formed in the first surface 31a of the phase control layer 30. The recessed portion 34 has a bottom. That is, the depth of the recessed portion 34 (i.e., the dimension of the recessed portion 34 taken along the thickness of the phase control layer 30) is smaller than the thickness of the phase control layer 30.

The phase control layer 30 has a first portion 30a and a second portion 30b. The first portion 30a is a region that overlaps the recessed portion 34 as viewed within a plane (i.e., as viewed along the direction of the thickness of the phase control layer 30). The second portion 30b is a region that surrounds the recessed portion 34 as viewed within a plane. The thickness T2 of the second portion 30b is greater than the thickness T1 of the first portion 30a. The difference (T2−T1) between the thickness T2 of the second portion 30b and the thickness T1 of the first portion 30a is equal to the thickness of the recessed portion 34.

The phase control layer 30 produces a given phase difference between electron waves transmitted through the first portion 30a and electron waves transmitted through the second portion 30b. In the phase control layer 30, electron waves passed through the second portion 30b can be shifted in phase with respect to electron waves passed through the first portion 30a by an odd multiple of $\pi/2$ by the difference between the thickness T1 of the first portion 30a and the thickness T2 of the second portion 30b.

Figure 18:
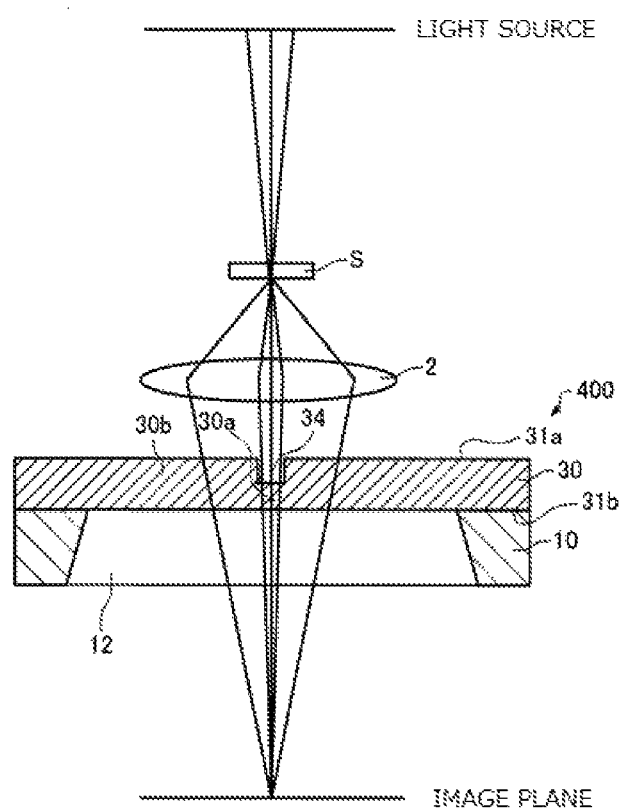
FIG. 18 is an electron-optical ray diagram, partly in cross section, illustrating the operation of a phase plate in a transmission electron microscope.

The operation of the phase plate 400 associated with the fourth embodiment is next described. An example in which the phase plate 400 is installed in a transmission electron microscope is first presented. FIG. 18 illustrates the operation of the phase plate 400 in a transmission electron microscope (phase contrast transmission electron microscope) equipped with the phase plate 400.

In the phase contrast transmission electron microscope, the phase plate 400 is placed at the back focal plane of the objective lens 2. Electron waves (direct waves) transmitted through the sample S after being produced from a light source and impinging on the sample S pass through the recessed portion 34 and the first portion 30a of the phase control layer 30 and reach the image plane. Electron waves diffracted by the sample S pass through the second portion 30b of the phase control layer 30 and reach the image plane. Then, the direct waves and diffracted waves interfere with each other at the image plane. At this time, the direct waves pass through the recessed portion 34 and the first portion 30a, while the diffracted waves pass through the second portion 30b. Therefore, the diffracted waves deviate in phase from the direct waves by an amount corresponding to the difference in thickness between the first portion 30a and the second portion 30b. Consequently, a phase contrast occurs at the image plane.

Figure 19:
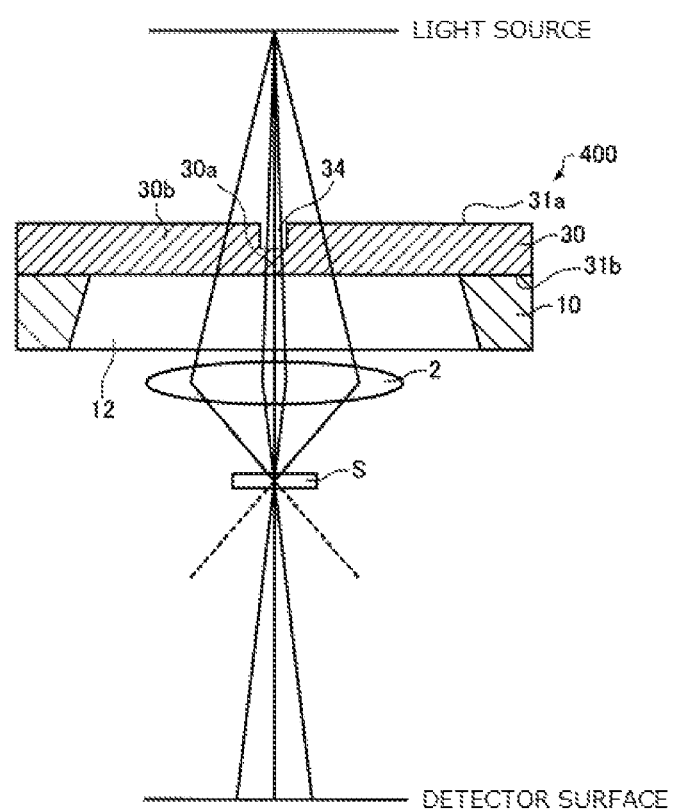
FIG. 19 is an electron-optical ray diagram, partly in cross section, illustrating the operation of a phase plate in a scanning transmission electron microscope.

An example in which the phase plate 400 is installed in a scanning transmission electron microscope is next given. FIG. 19 illustrates the operation of the phase plate 400 in a scanning transmission electron microscope (phase contrast scanning transmission electron microscope) equipped with the phase plate 400.

In the scanning transmission electron microscope, the phase plate 400 is placed at the front focal plane of the objective lens 2. Electron waves transmitted through the recessed portion 34 and the first portion 30a and electron waves transmitted through the second portion 30b are focused onto the sample S. The focused electrons (direct waves) passed through the sample S and the focused electrons diffracted by the sample S reach the detector surface. At this time, the direct waves transmitted through the recessed portion 34 and the first portion 30a and the diffracted waves transmitted through the second portion 30b interfere with each other on the detector surface. Since a relative phase difference is given between these direct waves and diffracted waves, a phase contrast occurs on the detector surface.

In the phase plate 400, the phase control layer 30 has the first portion 30a overlapping the recessed portion 34 as viewed within a plane and the second portion 30b surrounding the recessed portion 34 as viewed within a plane. The second portion 30b is thicker than the first portion 30a. Therefore, electric charges on the edges of the phase control layer (i.e., at the fringes of the recessed portion) where electric charges tend to collect can be better dissipated away, for example, as compared with the case where the phase control layer is provided with a through-hole. Hence, electrification of the phase plate can be suppressed. This makes it possible to reduce deterioration of the phase plate due to electrification. As a result, the life of the phase plate can be prolonged.

A support grid (not shown) may be used as the support body 10. The recessed portion 34 may be formed in the second surface 31b of the phase control layer 30 in an unillustrated manner. Also, in these cases, advantageous effects similar to those produced by the above-described phase plate 400 can be obtained.

4.2. Method of Fabricating Phase Plate

Figure 20:
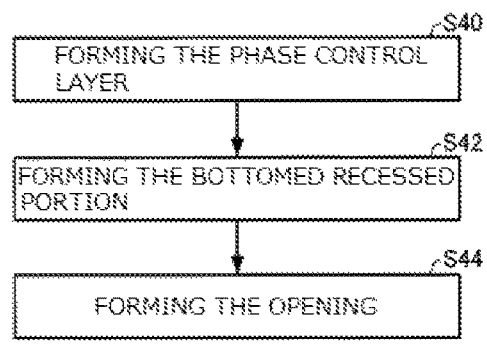
FIG. 20 is a flowchart illustrating one example of the method of fabricating the phase plate of FIG. 17.
Figure 21:
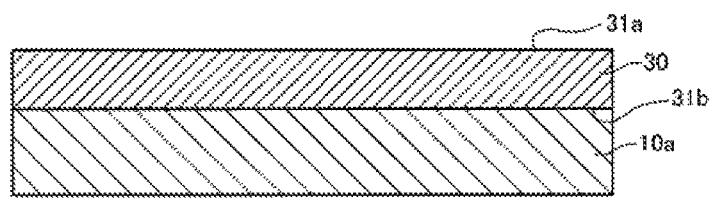
FIGS. 21 and 22 are schematic cross-sectional views illustrating a process sequence of fabricating the phase plate of FIG. 17.
Figure 22:
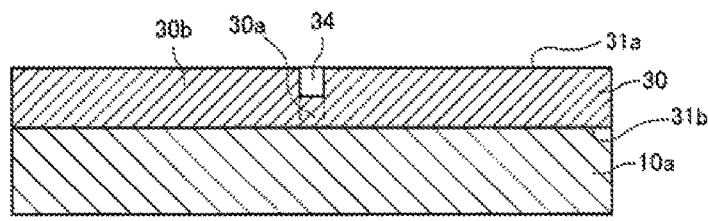

A method of fabricating the phase plate associated with the fourth embodiment is next described by referring to some drawings. FIG. 20 is a flowchart illustrating one example of the method of fabricating the phase plate 400 associated with the fourth embodiment. FIGS. 21 and 22 are cross-sectional views schematically illustrating a process sequence of fabricating the phase plate 400 associated with the fourth embodiment.

First, as shown in FIG. 21, the phase control layer 30 is formed on the substrate 10a (step S40). The control layer 30 is built up, for example, by vacuum evaporation, sputtering, ion plating, or CVD.

Then, as shown in FIG. 22, the bottomed recessed portion 34 is formed in the phase control layer 30 (step S42). The recessed portion 34 is produced, for example, by patterning the phase control layer 30 by photolithography and etching. The recessed portion 34 is formed by half-etching the phase control layer 30 (i.e., etching only the first surface (31a) side of the phase control layer 30 halfway along the thickness). Because the recessed portion 34 is formed in the phase control layer 30, the first portion 30a overlapping the recessed portion 34 as viewed within a plane and the second portion 30b surrounding the recessed portion 34 as viewed within a plane and thicker than the first portion 30a are formed in the phase control layer 30.

Then, as shown in FIG. 17, the substrate 10a is etched from its lower surface to form the opening 12 that exposes the conductive layer 20 (step S44). The present step is carried out in the same way as the step S16 of forming the opening 12 as already described in connection with FIG. 4. Because of the process steps described so far, the phase plate 400 can be fabricated.

The method of fabricating the phase plate 400 can yield advantageous effects similar to those produced by the above-described method of fabricating the phase plate 100.

5. Fifth Embodiment

Figure 23:
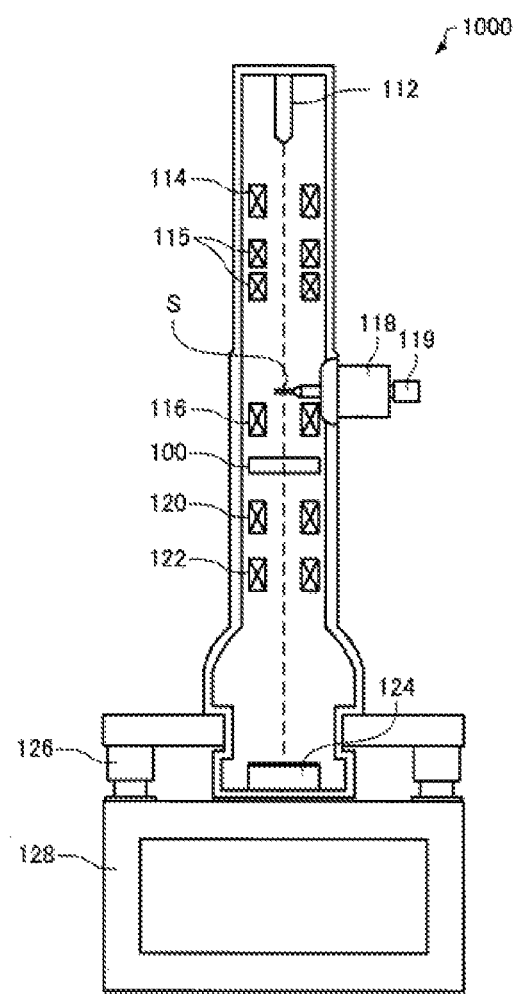
FIG. 23 is a schematic vertical cross section of an electron microscope associated with a fifth embodiment.

An electron microscope associated with a fifth embodiment is next described by referring to FIG. 23, which schematically shows the configuration of the electron microscope, 1000, associated with the fifth embodiment.

The electron microscope 1000 is a transmission electron microscope (TEM), which is an instrument for imaging electron waves transmitted through the sample S to obtain a transmission electron microscope (TEM) image.

The electron microscope 1000 includes a phase plate associated with the present invention. In the following description, an electron microscope configured including the phase plate 100 as the phase plate associated with the present invention is described. In FIG. 23, the phase plate 100 is shown in simplified form for the sake of convenience.

The electron microscope 1000 includes the phase plate 100, an electron beam source 112, a condenser lens system 114, an electron beam deflector 115, an objective lens 116, a sample stage 118, an intermediate lens 120, a projector lens 122, and a detector (imager) 124.

The electron beam source 112 produces an electron beam. The electron beam source 112 emits the electron beam by accelerating electrons by an anode after the electrons are emitted from a cathode. For example, an electron gun can be used as the electron beam source 112. No restriction is imposed on the electron gun used as the electron beam source 112. For example, a thermionic-emission electron gun, thermal field emission electron gun, cold cathode field-emission electron gun, or other electron gun can be used.

The condenser lens system 114 is disposed behind (on the downstream side relative to the direction of the electron beam) the electron beam source 112. The condenser lens system 114 operates such that the electron beam generated by the electron beam source 112 is focused onto a sample S. The condenser lens system 114 may be configured including a plurality of lenses (not shown).

The electron beam deflector 115 is located behind the condenser lens system 114, and can deflect the electron beam coming from the condenser lens system 114. Consequently, the angle of impingement of the beam on the surface of the sample S can be controlled.

The electron beam deflector 115 is configured, for example, including deflection coils for producing a magnetic field that deflects the electron beam. The electron beam deflector 115 has two sets of deflection systems (for example, upper and lower pairs of deflection coils) to deflect the electron beam.

The objective lens 116 is located behind the electron beam deflector 115. The objective lens 116 is an initial stage of lens for focusing the electron beam transmitted through the sample S. The objective lens 116 has an upper polepiece and a lower polepiece (none of which are shown). In the objective lens 116, a magnetic field is developed between the upper and lower polepieces to focus the electron beam.

The sample stage 118 holds the sample S. In the illustrated example, the sample stage 118 holds the sample S via a sample holder 119. The sample stage 118 places the sample S, for example, between the upper and lower polepieces of the objective lens 116. The sample stage 118 can place the sample S in position by moving and stopping the sample holder 119.

The intermediate lens 120 is positioned behind the objective lens 116. The projector lens 122 is disposed behind the intermediate lens 120. The intermediate lens 120 and the projector lens 122 further magnify the image focused by the objective lens 116 and focus the magnified image onto the detector (imager) 124. In the electron microscope 1000, an imaging system is constituted by the objective lens 116, intermediate lens 120, and projector lens 122.

The detector (imager) 124 captures the TEM image focused by the imaging system. The detector (imager) 124 is a digital camera such as a CCD camera, a CMOS camera, or the like.

The phase plate 100 is placed at the back focal plane of the objective lens 2. As described previously, the phase plate 100 produces a phase contrast by making diffracted waves and direct waves interfere with each other at the image plane. Consequently, the electron microscope 1000 can obtain a phase difference image (phase contrast image). That is, the electron microscope 1000 functions as a phase contrast transmission electron microscope.

In the illustrated example, the electron microscope 1000 is mounted over a pedestal 128 via vibration isolators 126. Because the electron microscope 1000 includes the phase plate 100 capable of suppressing electrification, a good phase contrast image less affected by the effects of electrification of the phase plate can be obtained.

6. Sixth Embodiment

Figure 24:
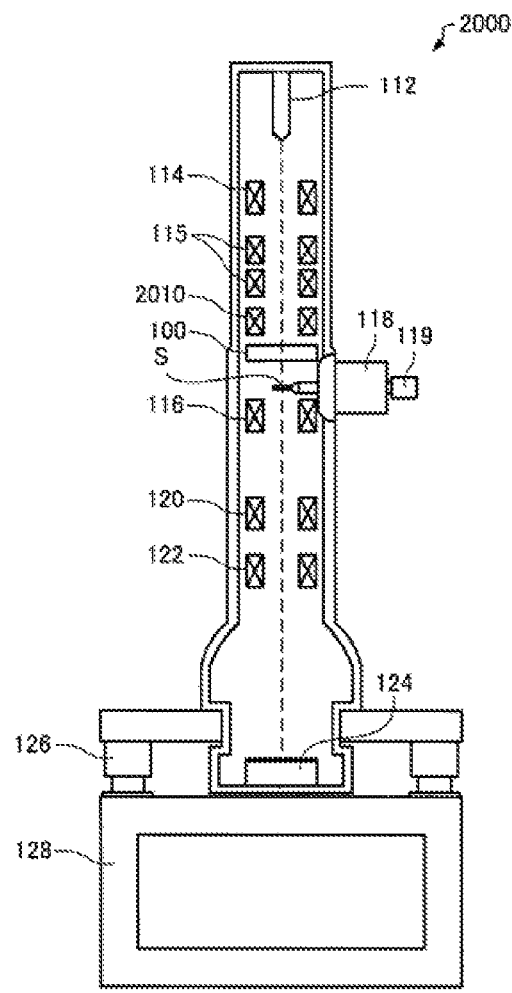
FIG. 24 is a schematic vertical cross section of an electron microscope associated with a sixth embodiment.
Figure 25:
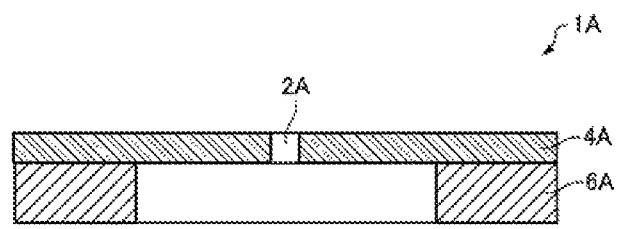
FIG. 25 is a schematic cross-sectional view of one conventional phase plate.

An electron microscope associated with a sixth embodiment is next described by referring to FIG. 24, which schematically shows the configuration of the electron microscope, 2000, associated with the sixth embodiment. Those members of the electron microscope 2000 associated with the sixth embodiment which are similar in function with their respective counterparts of the electron microscope 1000 associated with the fifth embodiment are indicated by the same reference numerals as in the above-cited figures and a detailed description thereof is omitted.

The electron microscope 2000 is a scanning transmission electron microscope (STEM), which is an instrument for obtaining a scanning transmission electron microscope (STEM) image by scanning an electron probe over the sample S and detecting electrons transmitted through the sample S.

The electron microscope 2000 includes a phase plate associated with the present invention. In the following, an electron microscope configured including the phase plate 100 as the phase plate associated with the present invention is described. In FIG. 24, the phase plate 100 is shown in simplified form for the sake of convenience.

The electron microscope 2000 includes the phase plate 100, the electron beam source 112, the condenser lens system 114, the electron beam deflector 115, an electron beam scanner 2010, the objective lens 116, the sample stage 118, the intermediate lens 120, the projector lens 122, and the detector 124.

The electron beam scanner 2010 is disposed behind the condenser lens system 114, and operates to deflect the electron beam to scan the electron beam (electron probe) focused by the condenser lens system 114 and the upper polepiece of the objective lens 116 over the sample S. The electron beam scanner 2010 has scan coils for deflecting the electron beam. The electron beam scanner 2010 scans the electron beam (electron probe) on the basis of a scan signal generated by a scan signal generator (not shown).

The electron microscope 2000 has an image processor (not shown) that performs processing to visualize the output signal (detection signal) from the detector 124 that is a signal indicative of the electron beam intensity in synchronism with the scan signal. Consequently, a scanning transmission electron microscope (STEM) image is generated. This STEM image represents a distribution of signal amounts (intensities of electron waves) corresponding to sample positions, and is derived by synchronizing the detection signal and the scan signal.

The phase plate 100 is disposed at the front focal plane of the objective lens 116. Electron waves transmitted through the through-hole 32 in the phase plate 100 and through the conductive layer 20 and electron waves transmitted through the phase control layer 30 and the conductive layer 20 are focused onto the sample S. Direct waves passed through the through-hole 32 and diffracted waves passed through the phase control layer 30 interfere with each other on the detector 124, thus producing a phase contrast. Consequently, the electron microscope 2000 can obtain a phase difference image (phase contrast image). That is, the electron microscope 2000 functions as a phase contrast scanning transmission electron microscope.

Because the electron microscope 1000 includes the phase plate 100 capable of suppressing electrification, a good phase contrast image less affected by the effects of electrification of the phase plate can be obtained.

It is to be understood that the above-described embodiments and modifications are merely exemplary and that the present invention are not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

What is claimed is:

1. A phase plate for use in an electron microscope, said phase plate comprising:
   a phase control layer provided with a through-hole and having a first surface and a second surface on the opposite side of the first surface; and
   at least one electrically conductive layer formed on at least one of the first and second surfaces of the phase control layer and covering and closing off the through-hole;
   wherein the phase control layer produces a given phase difference between electron waves transmitted through the phase control layer and electron waves transmitted through the through-hole.

2. A phase plate as set forth in claim 1, wherein said at least one electrically conductive layer is two in number, and wherein these two conductive layers are formed on said first surface and said second surface, respectively.

3. A phase plate as set forth in claim 1, wherein said conductive layer has a constant thickness.

4. A method of fabricating a phase plate for use in an electron microscope, comprising the steps of:
   forming an electrically conductive layer on a substrate;
   forming a phase control layer on the conductive layer, the phase control layer being provided with a through-hole; and
   etching the substrate from its surface on the opposite side of a surface of the substrate on which the conductive layer has been formed to form an opening that exposes the conductive layer;
   wherein the phase control layer produces a given phase difference between electron waves transmitted through the phase control layer and electron waves transmitted through the through-hole.

5. A method of fabricating a phase plate as set forth in claim 4, wherein said step of forming said phase control layer includes the steps of:
   forming the phase control layer on said conductive layer; and
   patterning the phase control layer by photolithography and etching to form said through-hole.

6. A method of fabricating a phase plate as set forth in claim 4, wherein during said step of forming said phase control layer, the phase control layer provided with the through-hole is formed by a lift-off technique.

7. A method of fabricating a phase plate as set forth in claim 4, wherein said substrate is a silicon substrate.

8. A method of fabricating a phase plate as set forth in claim 4, wherein during said step of forming the phase control layer, the phase control layer is formed using vacuum evaporation, sputtering, ion plating, or CVD.

9. An electron microscope including a phase plate as set forth in claim 1.

* * * * *